United States Patent
Chung et al.

(10) Patent No.: US 9,548,398 B2
(45) Date of Patent: Jan. 17, 2017

(54) NAND TYPE VARIABLE RESISTANCE RANDOM ACCESS MEMORY AND METHODS

(71) Applicant: NATIONAL CHIAO TUNG UNIVERSITY, Hsinchu (TW)

(72) Inventors: Steve S. Chung, Hsinchu (TW); E-Ray Hsieh, Kaohsiung (TW)

(73) Assignee: NATIONAL CHIAO TUNG UNIVERSITY, Hsinchu (TW)

(*) Notice: Subject to any disclaimer, the term of this patent is extended or adjusted under 35 U.S.C. 154(b) by 0 days.

(21) Appl. No.: 14/807,899

(22) Filed: Jul. 24, 2015

(65) Prior Publication Data

US 2016/0027844 A1    Jan. 28, 2016

Related U.S. Application Data

(60) Provisional application No. 62/029,582, filed on Jul. 28, 2014.

(30) Foreign Application Priority Data

Oct. 30, 2014    (TW) ............... 103137659 A

(51) Int. Cl.
  *H01L 29/792*    (2006.01)
  *H01L 27/24*    (2006.01)
  (Continued)

(52) U.S. Cl.
  CPC .......... *H01L 29/792* (2013.01); *G11C 13/0069* (2013.01); *G11C 13/0097* (2013.01);
  (Continued)

(58) Field of Classification Search
  CPC .. H01L 27/2436; H01L 45/1233; H01L 45/16; H01L 45/1253; H01L 29/792; H01L 45/145; H01L 27/2463; G11C 13/0069; G11C 13/0097; G11C 8/14
  See application file for complete search history.

(56) References Cited

U.S. PATENT DOCUMENTS

| 2004/0120186 A1* | 6/2004 | Fasoli ............... G11C 16/0416 365/185.2 |
| 2008/0211011 A1* | 9/2008 | Takashima ............ H01L 29/792 257/324 |

(Continued)

*Primary Examiner* — Harry W Byrne
*Assistant Examiner* — Ajay Ojha
(74) *Attorney, Agent, or Firm* — CKC & Partners Co., Ltd.

(57) ABSTRACT

A high density NAND-type nonvolatile resistance random access storage circuit and its operations are shown herein. A unit memory cell of the circuit includes a field effect transistor (FET) with a resistance changeable component connected to its gate electrode. The field effect transistor is an n-channel field effect transistor or a p-channel field effect transistor. By applying the voltage or current between the top electrode of the resistive random access component and the FET drain or source electrode, more than two stable states can be maintained such that these states can be drawn from the FET drain or source terminal. The NAND circuit includes the above unit cell as a center to form a multi-bit memory. The circuit consists of multi-bit memories connected in series, has a NAND logic gate function, and forms output of this NAND circuit which can be drawn in a form of series output.

10 Claims, 15 Drawing Sheets

(51) Int. Cl.
*G11C 13/00* (2006.01)
*H01L 45/00* (2006.01)
*G11C 8/14* (2006.01)

(52) U.S. Cl.
CPC ...... *H01L 27/2436* (2013.01); *H01L 27/2463* (2013.01); *H01L 45/1253* (2013.01); *H01L 45/145* (2013.01); *G11C 8/14* (2013.01); *H01L 45/04* (2013.01); *H01L 45/1233* (2013.01); *H01L 45/16* (2013.01)

(56) References Cited

U.S. PATENT DOCUMENTS

| | | | | |
|---|---|---|---|---|
| 2012/0020138 A1* | 1/2012 | Lue | ................ | G11C 11/5685 365/63 |
| 2014/0016399 A1* | 1/2014 | Lu | ........................ | G11C 8/14 365/149 |

\* cited by examiner

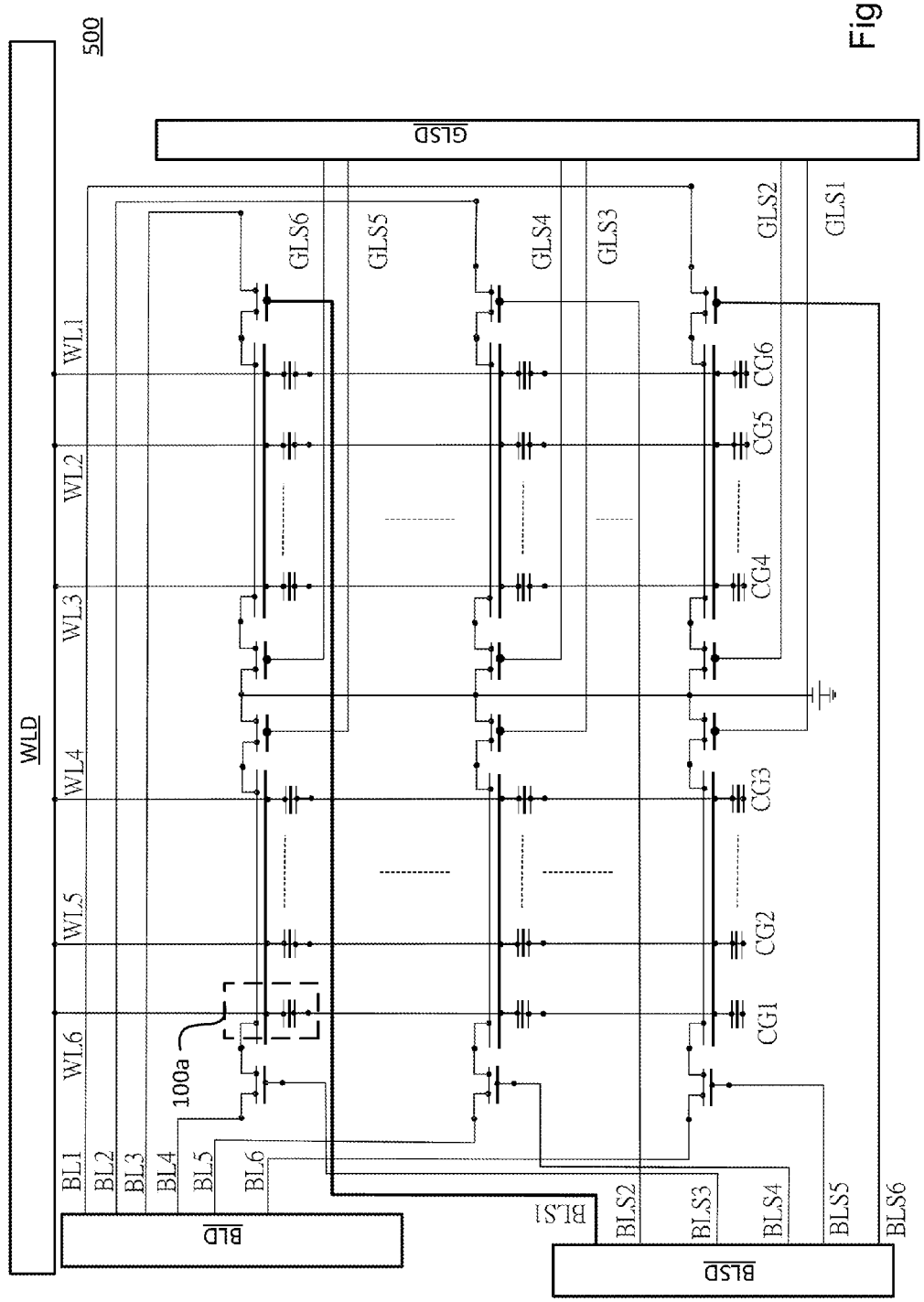

NAND TYPE VARIABLE RESISTANCE RANDOM ACCESS MEMORY AND METHODS

RELATED APPLICATIONS

This application claims priority under U.S. Provisional Application No. 62/029,582 filed Jul. 28, 2014 and Taiwanese Patent Application No. 103137659 filed Oct. 30, 2014.

BACKGROUND

Field of Invention

The invention relates to a nonvolatile memory circuit, and in particular relates to a resistance random access memory circuit.

Description of Related Art

The flash memory is a non-volatile memory capable of being erased or programmed repeatedly in operation. This technique is widely applied for general data storage, and for data exchange and transmission between a computer and other digital products such as a memory card, a flash drive, and the like.

SUMMARY

An aspect of the disclosure provides a non-volatile resistance random access storage circuit including a plurality of memory units, wherein each of these memory units includes: a field effect transistor including a gate electrode, a source electrode, and a drain electrode; a resistance changeable component including a first terminal electrically connected to the gate electrode and a second terminal electrically connected to a conducting electrode; wherein the resistance changeable component is formed by laminating at least one oxide layer onto at least one first metal layer and then laminating at least one second metal layer on the oxide layer, wherein the resistance, conductivity or conducting current of the resistive resistance changeable component has more than two stable states according to a voltage difference or a current source applied between the first terminal and the second terminal of the resistance changeable component. In an embodiment of the disclosure, the gate electrode can also be used as the first metal layer of the resistance changeable component.

In an embodiment of the disclosure, the gate electrode is also used as the first metal layer of the resistive resistance changeable component.

In an embodiment of the disclosure, the non-volatile resistance random access storage circuit further includes a word line extended from a word selecting driving circuit used for control the memory unit, wherein the resistance changeable component is arranged on any position of the word line.

In an embodiment of the disclosure, the source electrode of each memory unit is coupled to the drain electrode of an adjacent memory unit in series to form a memory block. The non-volatile resistance random access storage circuit further includes a plurality of word lines electrically connected to a word selecting driving circuit; a plurality of bit lines electrically connected to a bit driving circuit; a plurality of ground lines electrically connected to a ground driving circuit; a first control transistor including a gate terminal, a first terminal, and a second terminal, wherein the gate terminal is electrically connected to a bit-line selecting driving circuit through a bit addressing line, the first terminal is electrically connected to the front end of the memory page, and the second terminal is electrically connected to one of these bit lines; and a second control transistor including a gate terminal, a first terminal, and a second terminal, wherein the gate terminal is electrically connected to a ground-line selecting driving circuit through a ground line, wherein the first terminal is electrically connected to the back end of the memory page, the second terminal is electrically connected to a source bias; wherein the second terminals of the resistance changeable components in the memory block are electrically connected to one of these word lines. In an embodiment of the disclosure, two adjacent memory blocks are connected in series through a common source bias.

Another aspect of the disclosure provides a non-volatile resistance random access storage circuit, which includes a field effect transistor including a gate electrode; a plurality of resistance changeable components each including a first terminal electrically connected to the gate electrode, and a second terminal electrically connected to a corresponding conducting electrode; wherein the resistance changeable component is formed by placing at least one metal oxide layer between the above two electrodes, wherein the resistance, the conductivity and the conducting current of the resistance changeable component have more than two stable states according to a voltage difference or a current source applied between the first terminal and the second terminal of the resistance changeable component, and when a bias is applied on the corresponding conducting electrode, the bias enables one region of the transistor to be conducted partially, and a memory unit is formed by this area and the resistance changeable component controlled by the conducting electrode. A further aspect of the disclosure provides a method for controlling a non-volatile resistance random access storage circuit, wherein the non-volatile resistance random access storage circuit includes a plurality of memory units connected in series and formed as a memory block. Each of these memory units includes a field effect transistor and a resistance changeable component. The controlling method includes: applying a fixed bias on the field effect transistor of these memory units in a non-operation state and measuring a conducting current as a reference current value; performing a resetting operation to set these memory units in the memory block in a first state; and performing a setting operation to set selected memory units in the memory block to a second state.

In an embodiment of the disclosure, the resetting operation includes: selecting the memory block through a bit-line selecting driving circuit and a ground-line selecting driving circuit such that a first control transistor and a second control transistor connected to the memory block are conducted; connecting a corresponding bit line and a corresponding source bias to the ground; applying a first bias onto the memory units of the memory block, such that the state of these resistance changeable components of these memory units connected to the word lines is set to a first state.

In an embodiment of the disclosure, the setting operation includes: conducting the first control transistor of the memory page by the bit selecting driving circuit; turning off the second control transistor of the memory page by the ground-line selecting driving circuit; selecting a target memory unit from the memory page by the word selecting driving circuit and applying a second bias onto a corresponding word line to change the state of the resistance changeable component of the selected memory unit from the first state into a second state; and applying a third bias onto unselected word lines such that the transistors of the unselected memory units are conducted, and the resistive switching components of the unselected memory units are maintained in the original state.

In an embodiment of the disclosure, the setting operation includes: selecting the memory page by the bit-line selecting driving circuit, and applying a fourth bias such that the fourth bias is divided onto these selected memory units through these unselected memory units of the memory page; and changing the state of the resistance changeable components of these selected memory units from the first state into the second state by the divided voltage of the fourth bias.

In an embodiment of the disclosure, the controlling method further includes: applying a control voltage onto the first and second control transistors to conduct them; applying a read voltage onto the selected bit line; applying an inductive voltage onto the selected bit line; applying a testing voltage onto a corresponding word line of a memory unit to be tested; applying a maintaining voltage onto the word lines of other memory units such that the transistors of the memory units are conducted without changing the state of the resistive switching components in these memory units; and driving a storage-state testing circuit connected to the bit line of the memory page based on whether the memory unit to be tested is conducted to determine the value of resistance, resistivity or conducting current of the resistance changeable component stored in the memory unit.

In view of the above, the technical solutions of the disclosure have obvious advantages and superior performance over the structure and technique of an existing SONOS (silicon-oxide-nitride-oxide-silicon) memory. Through the aforementioned technical solutions, considerable technical progresses can be achieved as well as a wide range of applications in the industry.

BRIEF DESCRIPTION OF THE DRAWINGS

FIG. 5 shows a NAND-type resistance random access memory circuit illustrated according to yet a further embodiment of the disclosure;

DETAILED DESCRIPTION

For a better understanding of the structure and operation of the memory of the disclosure, the disclosure will be described in details in the following embodiments with reference to the accompanying drawings. However, the embodiments described are not intended to limit the scope of the disclosure. Moreover, it is not intended for the description of structure and operation to limit the order of implementation. Any device with equivalent functions that is produced from a structure formed by a recombination of elements shall fall within the scope of the disclosure. Furthermore, according to standards and regular practices in the industry, the drawings are shown only for purpose of facilitating illustration, and are not depicted according to the original scale. In practice, the sizes of various features can be optionally increased or decreased for ease of illustration. For convenience of understanding, the same reference numbers represents the same elements in the following description.

Terms used throughout the specification and the claims often have the general meaning of each term used in the art, the disclosure and a specific content, unless otherwise stated specifically. Some terms used for describing the disclosure will be discussed hereafter or at other places of the specification, so as to provide additional guiding with respect of the description of the disclosure for those of skills in the art.

The "about", "approximately" or "substantially" used herein generally refer to a numeral error or scope within 20%, preferably within 10%, and more preferably within 5%. If it is not sated explicitly, the referred numbers are all regarded as approximate values with for example the error or scope represented by the phrases "about", "approximately" or "substantially" or other approximate values.

Furthermore, the phrases "include", "comprise", "have", "contain" are all open phrases, meaning "including but not limited to". Furthermore, the phrase "and/or", as used herein includes any one of one or more relevant listed items, and all combinations thereof.

Herein, when an element is described as "connected" or "coupled", it refers to "electrically connected" or "electrically coupled", "connected" or "coupled" can also be used to represent cooperative operation or interaction between two or more elements. Also, although herein various elements are described with phrases such as "first", "second", . . . , these phrases are only used for distinguishing the elements or operations described with the same technical phrase. Unless being designated clearly in the context, these phrases are not used for specifically referring to or implying an order or sequential positions, and are also not meant to limit the disclosure.

Figure 1A:
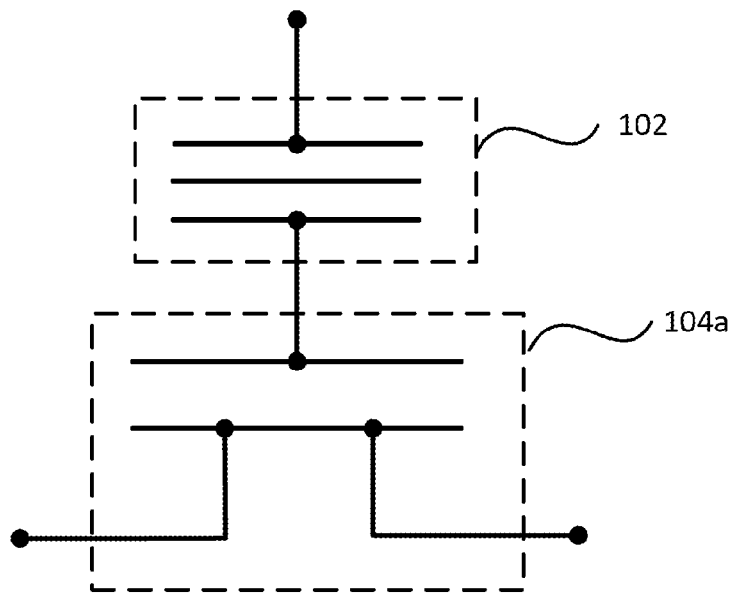
FIGS. 1A-1D are equivalent circuit diagrams of the memory unit illustrated according to an embodiment of the disclosure.
Figure 1B:
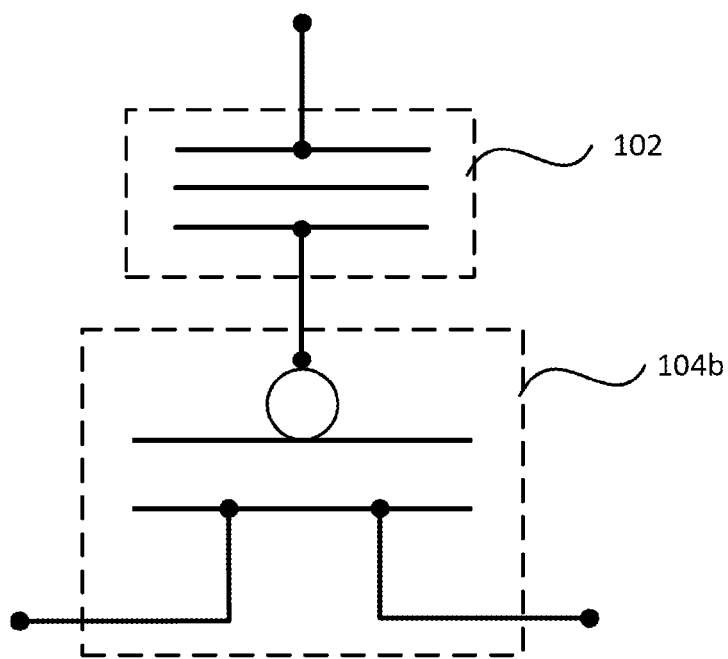

An embodiment of the disclosure provides a high-density non-volatile resistance random access storage circuit. As shown in FIGS. 1A and 1B, a single memory unit 100a or 100b of the circuit is formed by connecting a resistive switching component 102 to the gate electrode of a field effect transistor 104a or 104b; then connecting a conducting electrode to the other terminal of the resistive switching component 102, wherein the resistive switching component 102 is formed by laminating at least one oxide layer onto at least one metal layer, and then laminating at least one metal layer on the oxide layer. The resistance, conductivity or conducting current of the resistance changeable component 102 has more than two stable states as a result of the voltage applied across electrodes at two ends thereof, wherein the field effect transistor 104a or 104b which forms the memory unit 100a or 100b is an n-channel transistor (e.g., the field effect transistor 104a) or a p-channel transistor (e.g., the field effect transistor 104b).

Figure 1C:
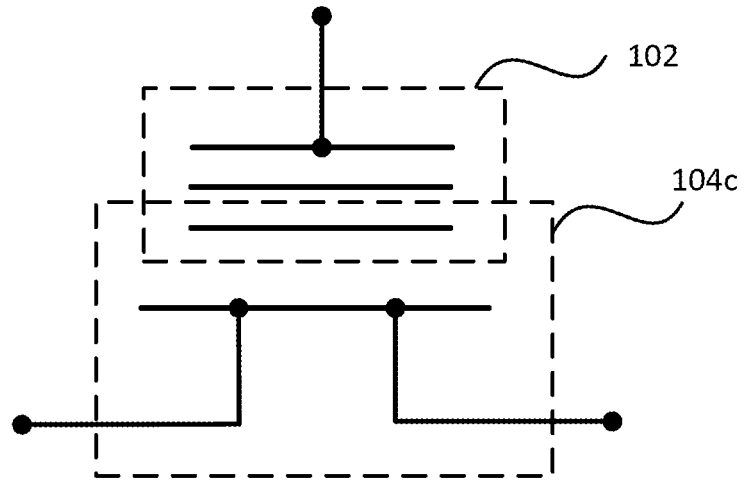
Figure 1D:
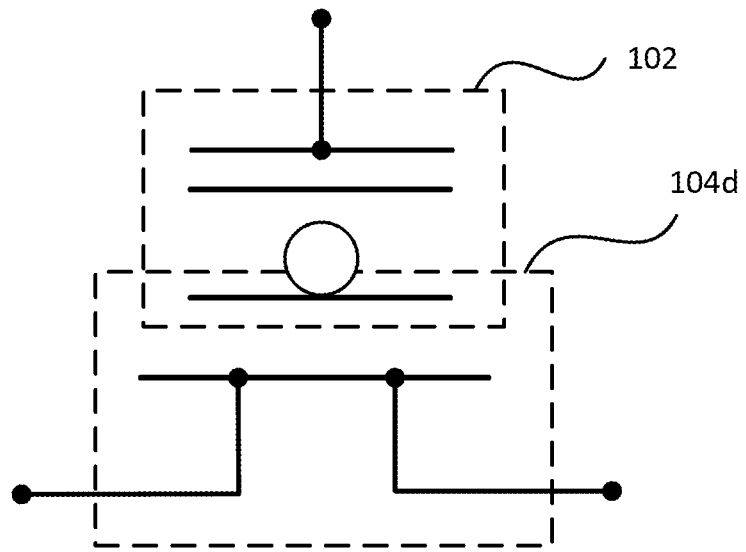

Another embodiment of the disclosure provides a high-density non-volatile resistance random access storage circuit. As shown in FIGS. 1C and 1D, a single memory unit 100c or 100d of the circuit is formed by connecting a resistance changeable component 102 to the gate electrode of a field effect transistor 104c or 104d; and then connecting a conducting electrode to the other terminal of the resistance changeable component 102, wherein the gate electrode of the connected transistor is also used as the metal layer of the resistance changeable component 102. The resistance changeable component 102 is formed by laminating at least one oxide layer onto at least one metal layer, and then laminating at least one metal layer onto the oxide layer. The resistance, conductivity or conducting current of the resistance changeable component 102 have more than two stable states by applying a voltage difference across electrodes at two ends thereof, wherein the field effect transistor 104c or 104d which forms the memory unit 100c or 100d is an n-channel transistor (e.g., the field effect transistor 104c) or a p-channel transistor (e.g., the field effect transistor 104d).

Figure 2:
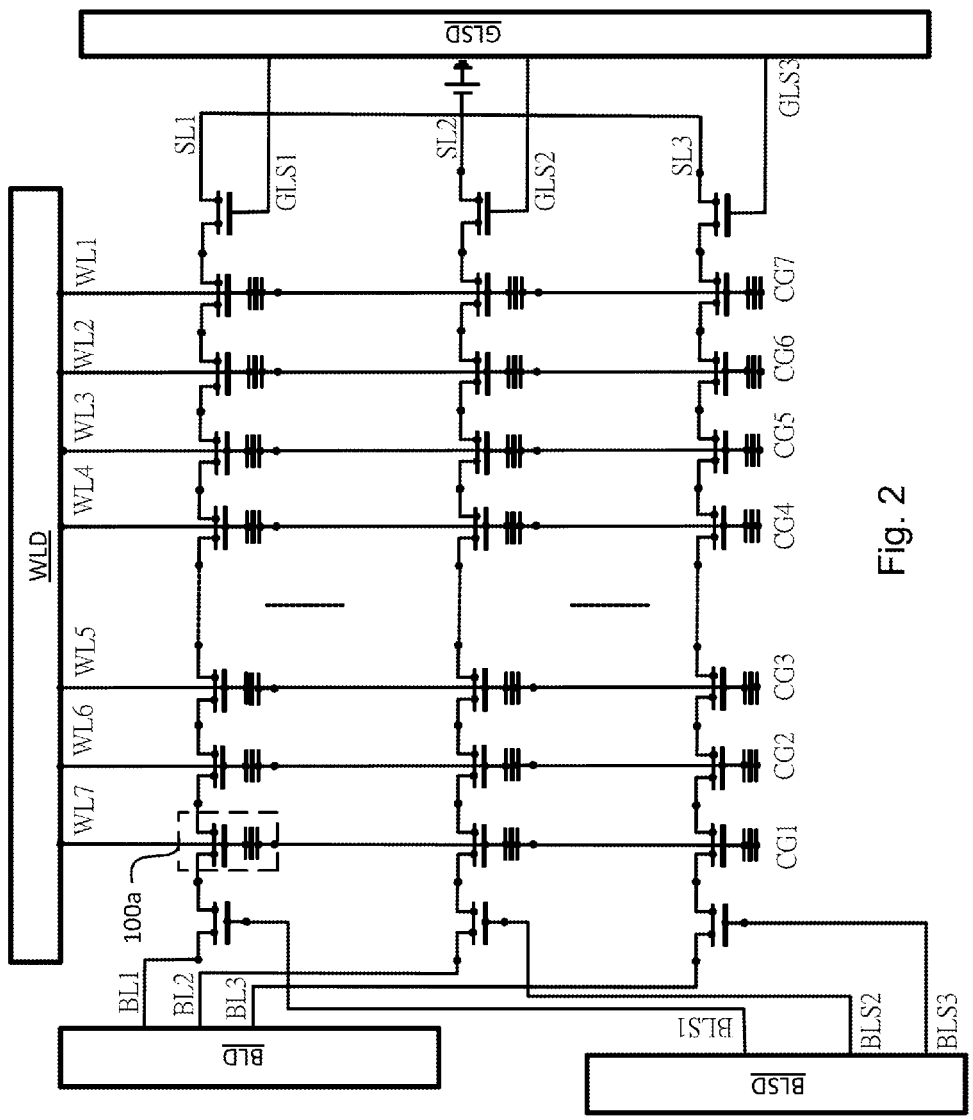
FIG. 2 shows a NAND-type resistance random access memory circuit illustrated according to an embodiment of the disclosure.
Figure 3:
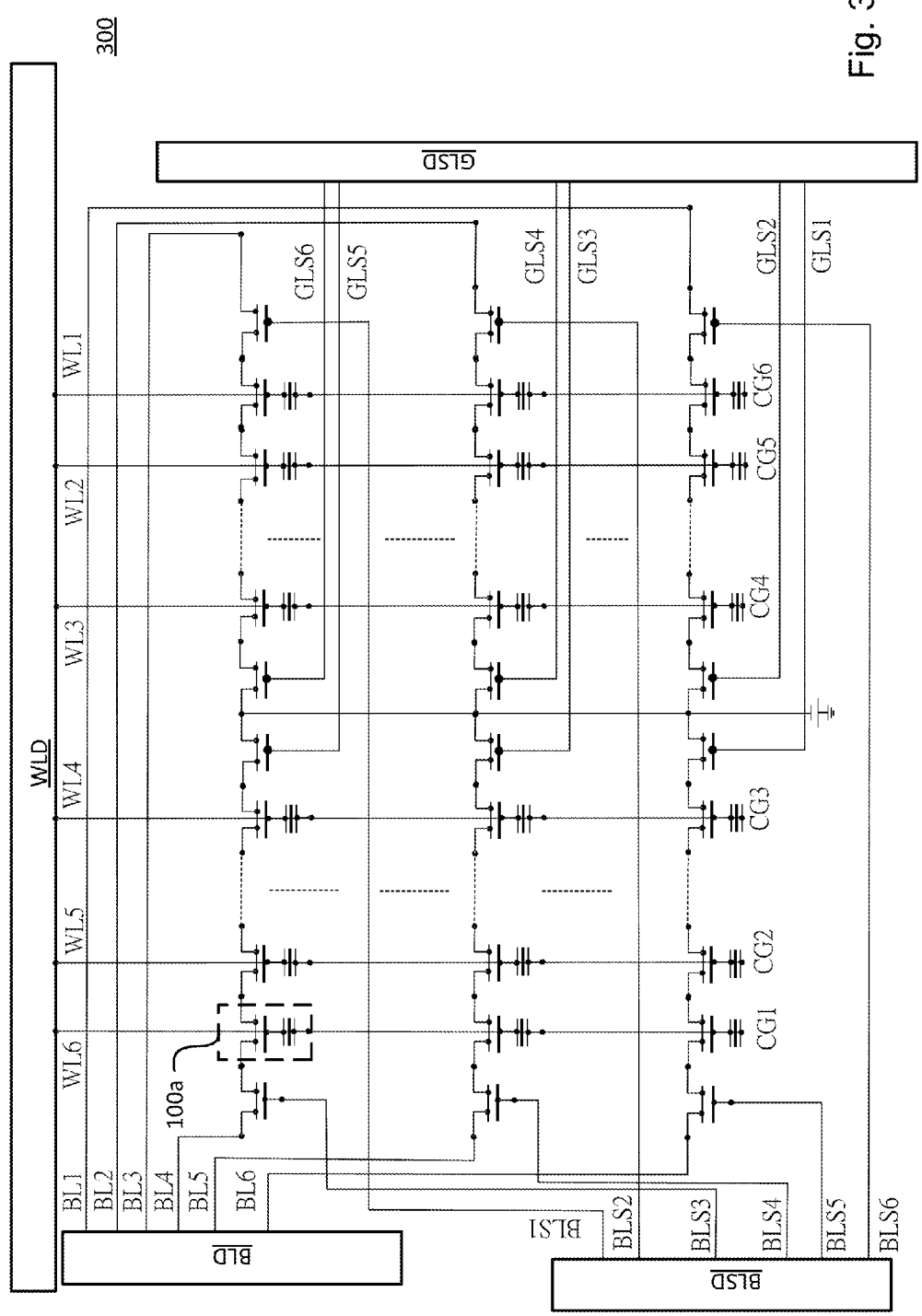
FIG. 3 shows a NAND-type resistance random access memory circuit illustrated according to another embodiment of the disclosure.

A further embodiment of the disclosure provides high-density non-volatile resistance random access storage circuits 200 and 300. As shown in FIGS. 2 and 3, a single memory unit (e.g., memory unit 100a) is formed by connecting word lines WL1-WL7 extended from a word selecting driving circuit WLD which controls the memory unit to the gate electrodes CG1-CG7 of a field effect transistor (e.g., field effect transistor 104a), and then depositing a resistance changeable component 102 on any position passing through the word lines WL1-WL7. The resistance changeable component 102 is formed by laminating at least one oxide layer onto at least one metal layer, and then laminating at least one metal layer onto the oxide layer. The resistance, conductivity or conducting current of the resistance changeable component 102 has more than two stable states as a result of a voltage difference or a current source applied across electrodes at two ends thereof, wherein the field effect transistor which forms the memory unit is an n-channel transistor or a p-channel transistor.

Figure 4:
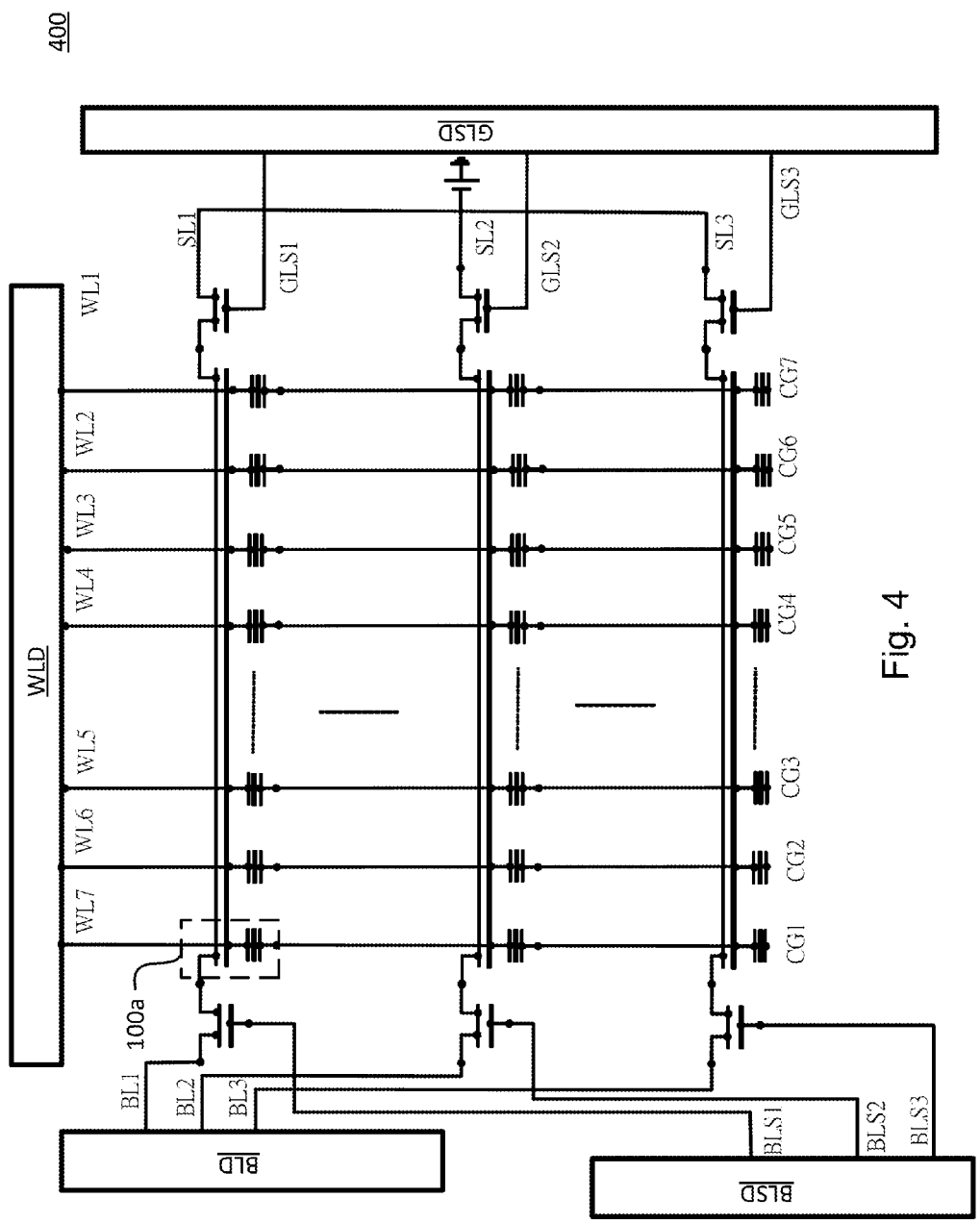
FIG. 4 shows a NAND-type resistance random access memory circuit illustrated according to a further embodiment of the disclosure.
Figure 6A:
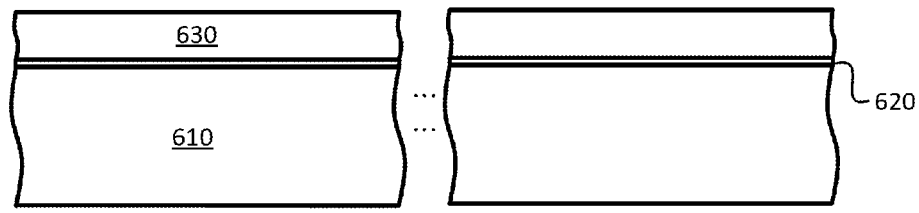
FIGS. 6A-6D are schematic views illustrating steps of a manufacturing process of the memory circuit illustrated according to an embodiment of the disclosure.
Figure 6B:
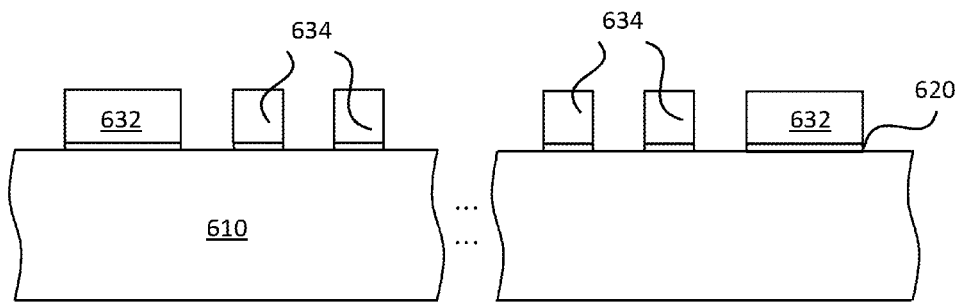
Figure 6C:
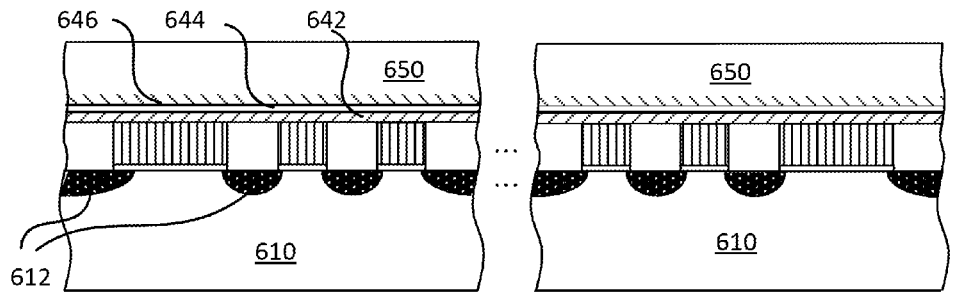
Figure 6D:
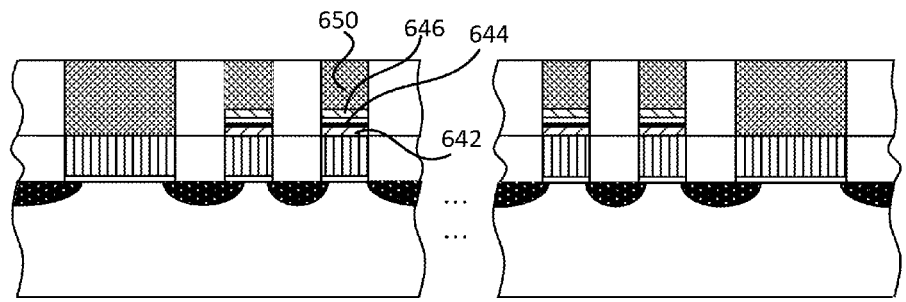
Figure 7A:
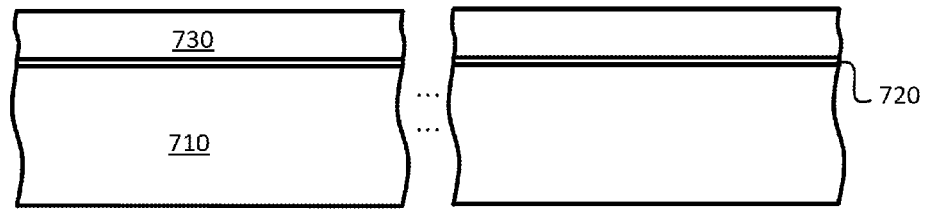
FIGS. 7A-7E are schematic views illustrating steps of a manufacturing process of the memory circuit illustrated according to another embodiment of the disclosure.
Figure 7B:
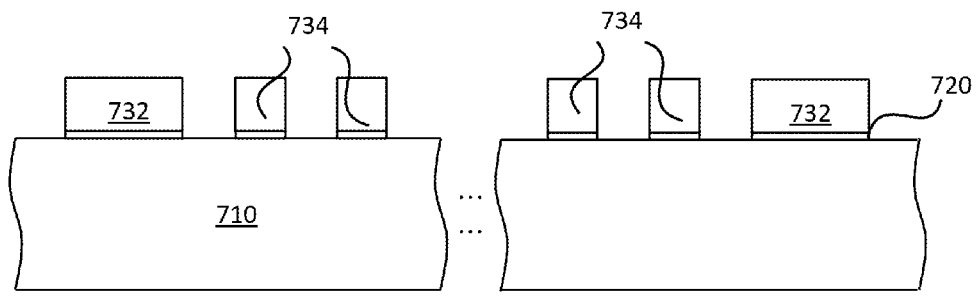
Figure 7C:
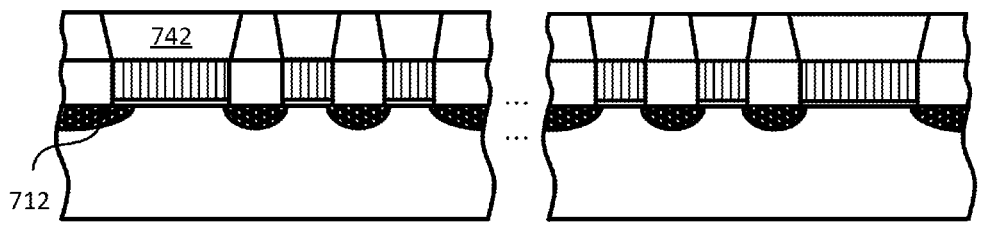
Figure 7D:
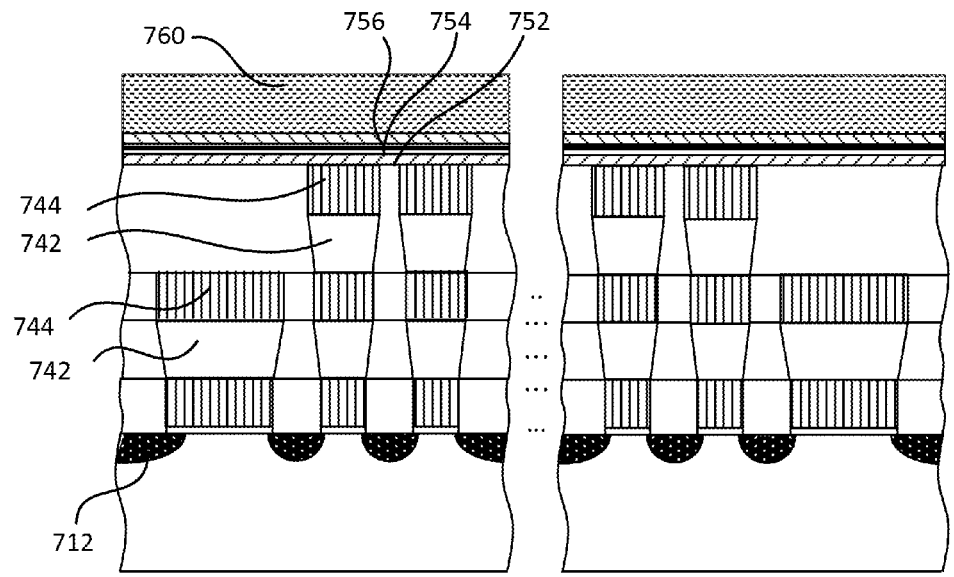
Figure 7E:
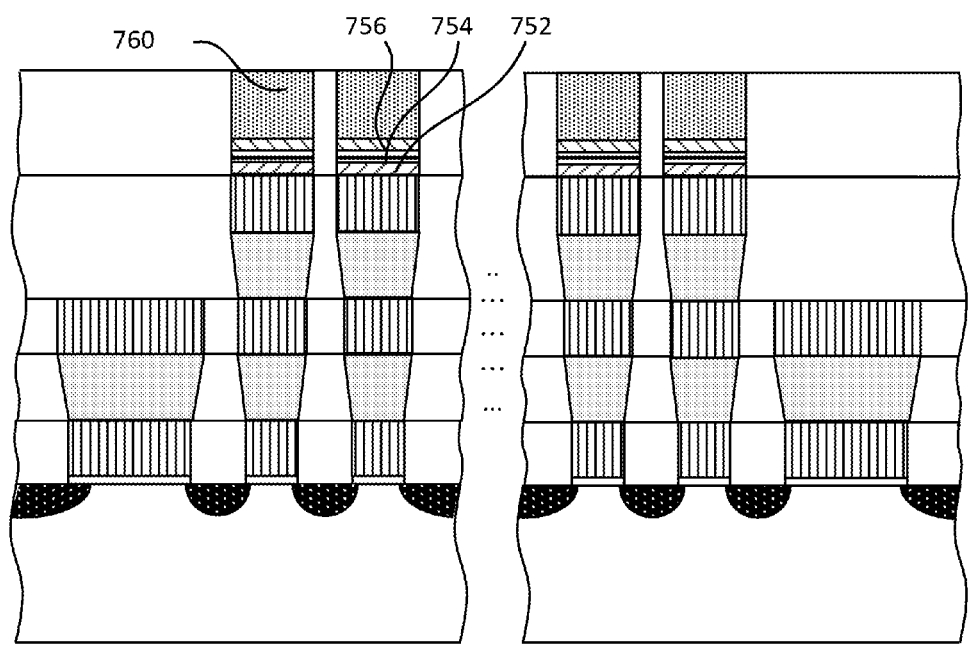
Figure 8A:
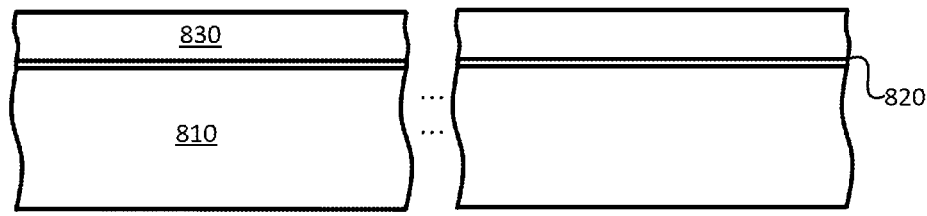
FIGS. 8A-8D are schematic views illustrating steps of a manufacturing process of the memory circuit illustrated according to a further embodiment of the disclosure.
Figure 8B:
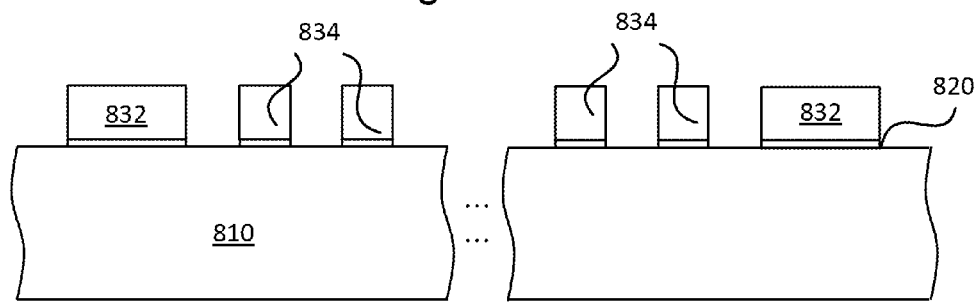
Figure 8C:
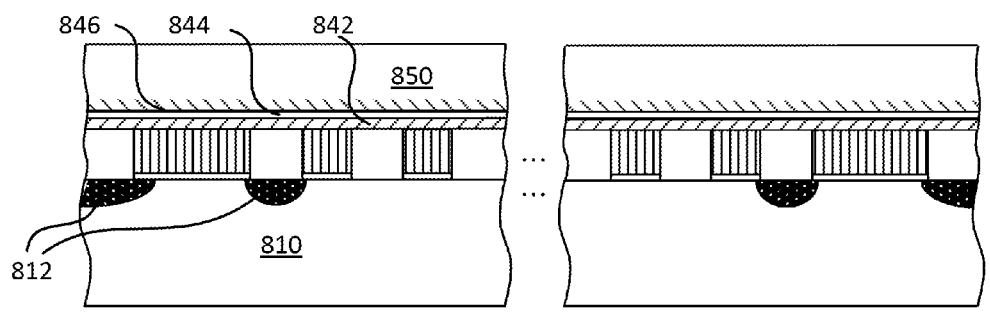
Figure 8D:
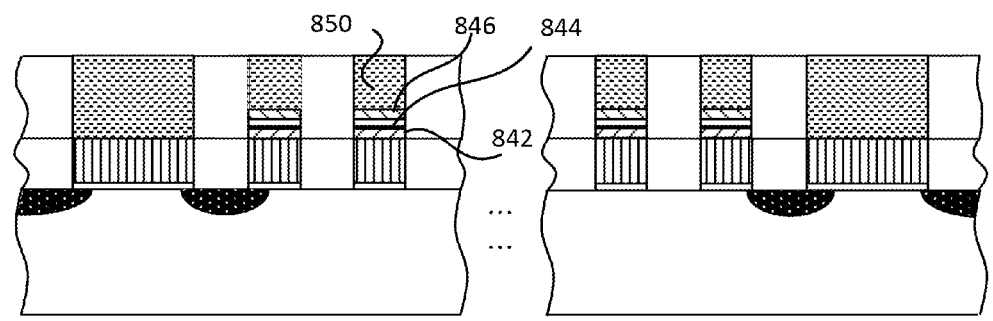
Figure 9A:
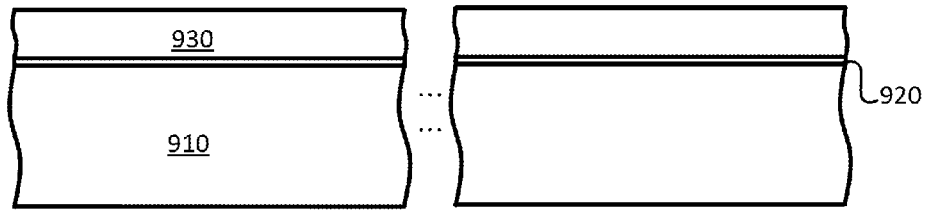
FIGS. 9A-9E are schematic views illustrating steps of a manufacturing process of the memory circuit illustrated according to yet a further embodiment of the disclosure.
Figure 9B:
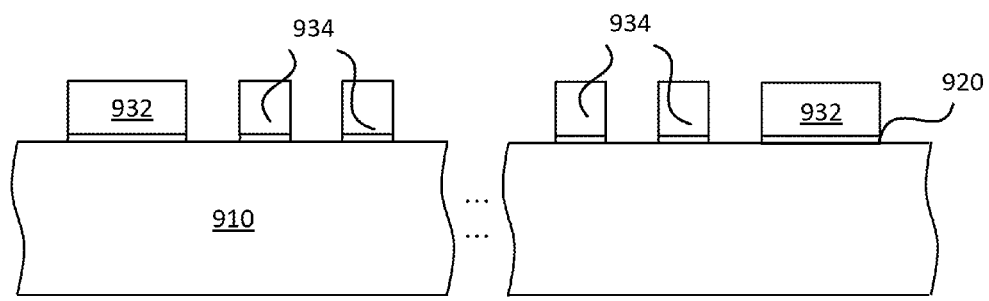
Figure 9C:
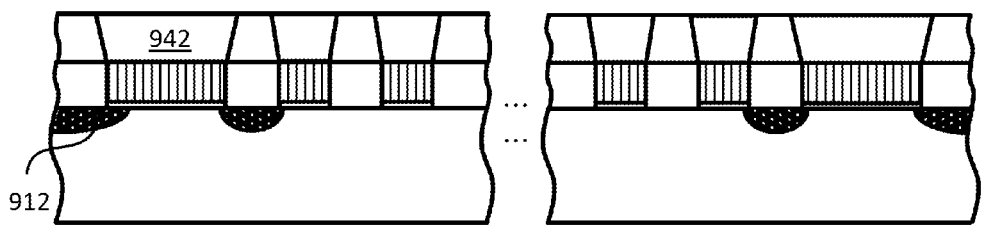
Figure 9D:
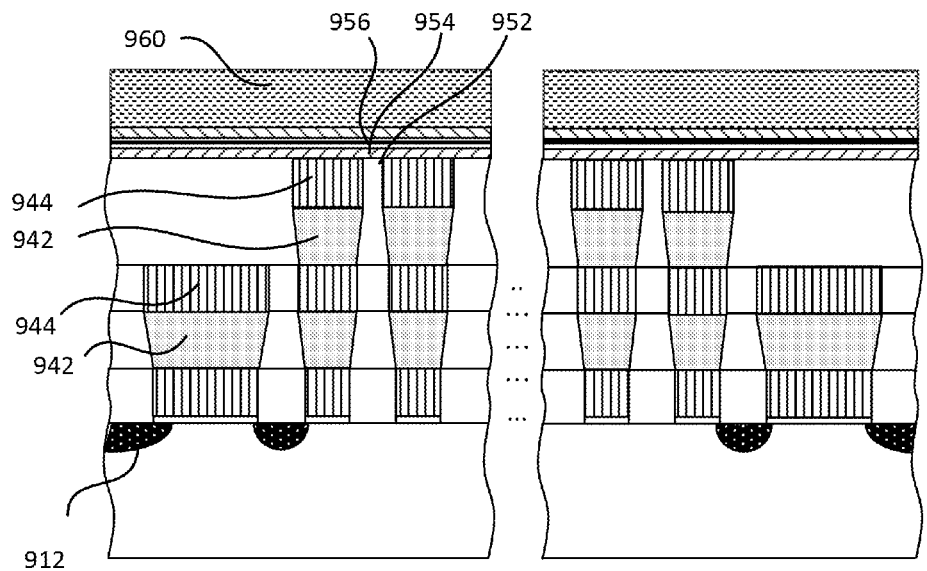
Figure 9E:
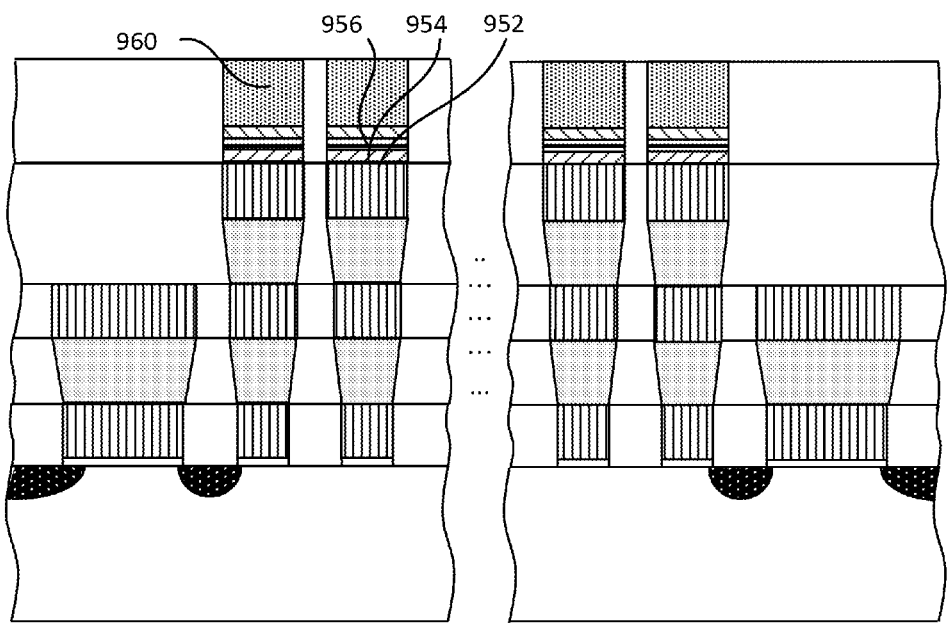
Figure 10A:
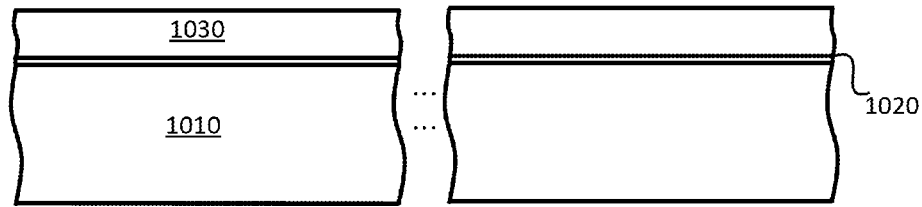
FIGS. 10A-10D are schematic views illustrating steps of a manufacturing process of the memory circuit illustrated according to still yet a further embodiment of the disclosure.
Figure 10B:
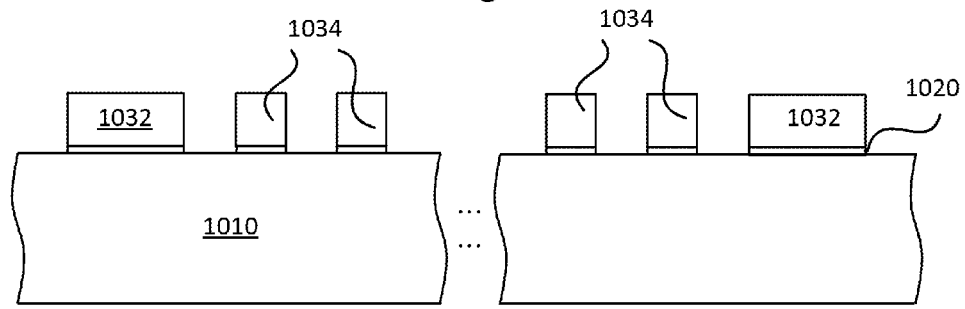
Figure 10C:
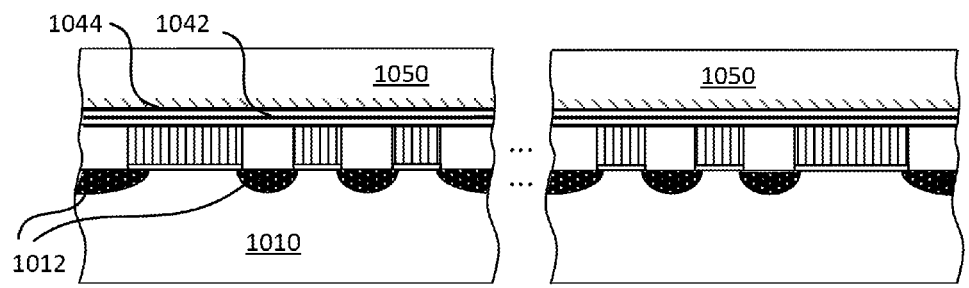
Figure 10D:
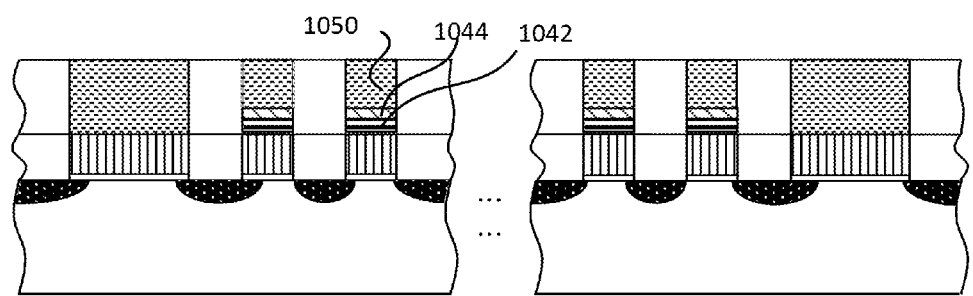
Figure 11A:
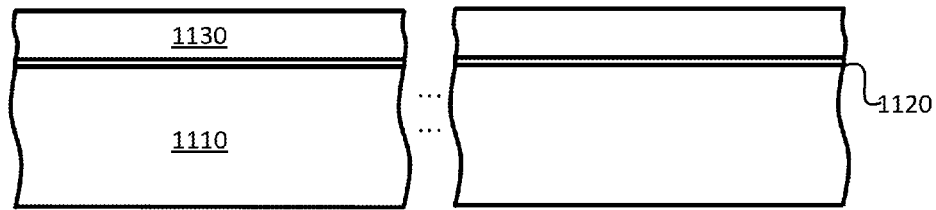
FIGS. 11A-11D are schematic views illustrating steps of a manufacturing process of the memory circuit illustrated according to still yet a further embodiment of the disclosure.
Figure 11B:
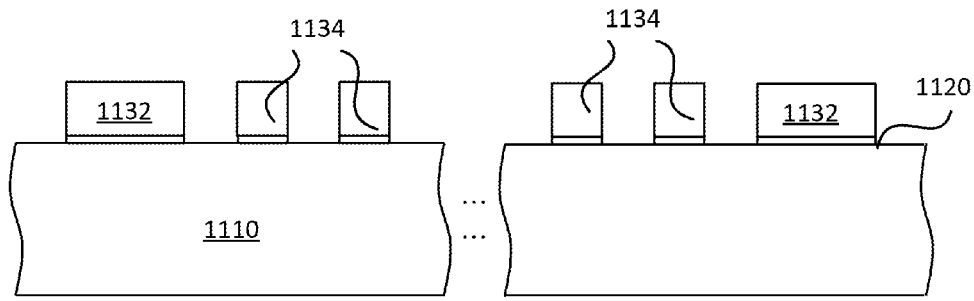
Figure 11C:
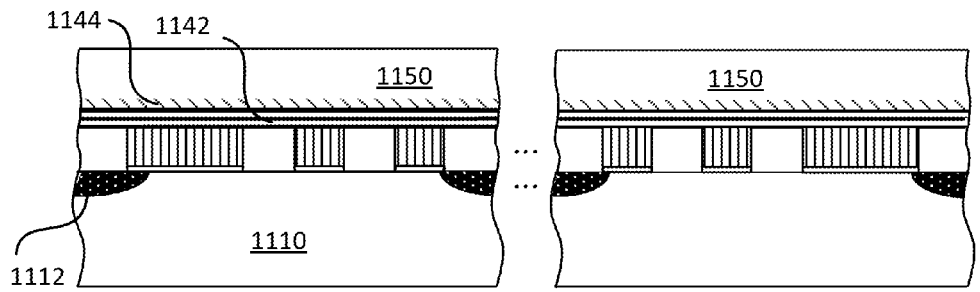
Figure 11D:
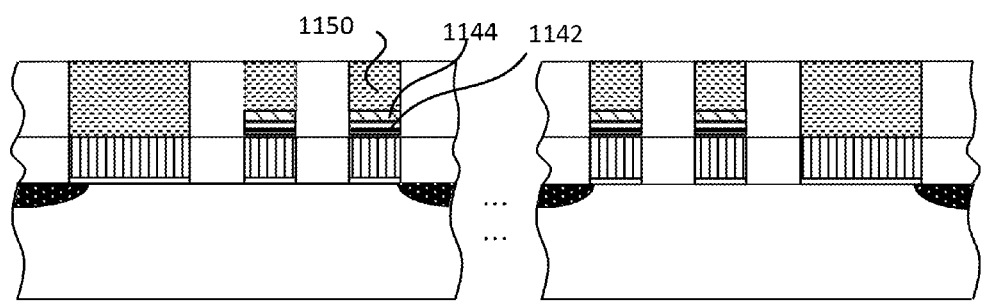

Yet a further embodiment of the disclosure provides high-density non-volatile resistance random access storage circuits 400 and 500. As shown in FIGS. 4 and 5, the circuit is formed by connecting more than one resistance changeable components 102 in parallel to the gate electrode of a field effect transistor; then connecting a conducting electrode at the other terminal of the resistive switching component 102. Therefore, when a bias is applied to the conducting electrode, a memory unit is defined as including the gate electrode of the transistor; the gate oxide layer of the transistor; the partially conducted region sensed by the transistor channel as caused by the bias of the transistor; and the resistance changeable component 102 controlled by the conducting electrode. The resistance changeable component 102 is formed by laminating at least one oxide layer onto at least one metal layer, and then laminating at least one metal layer onto the oxide layer. The resistance, conductivity or conducting current of the resistance changeable component 102 have more than two stable states due to a voltage difference or a current source applied across electrodes at two ends thereof, wherein the field effect transistor which forms the memory unit is an n-channel transistor or a p-channel transistor.

As shown in FIGS. 2 and 4, single memory units are connected in series to form a memory block by connecting the drain electrode of the field effect transistor of one memory unit to the source electrode of the transistor of an adjacent memory element, or by connecting the source electrode of one memory unit to the drain electrode of the transistor of an adjacent memory element and the source electrode of the transistor of an adjacent memory unit. Also at least more than one memory block can be connected in parallel in this storage circuit. In each memory unit used for forming the memory page, one of two electrodes of the resistive switching component 102 not connected to the gate electrode of the transistor is connected to one of the word lines WL1-WL7, and the word lines WL1-WL7 are connected to the word selecting driving circuit WLD; the front and back ends of the memory page are respectively connected to the source electrode or drain electrode of one control FET, and the gate electrode of the control transistor of the front end of the memory page is connected to bit addressing lines BLS1-BLS3 which are connected to the bit-line selecting driving circuit BLSD, and the drain or source electrode of the control transistor not connected to the memory block is connected to one of the bit lines BL1-BL3, wherein the bit lines BL1-BL3 is connected to a circuit used for determining the memory state and the bit driving circuit BLD; and the gate electrode of the control FET of the back end of the memory page is connected to the ground lines GLS1-GLS3 which are connected to the ground-line selecting driving circuit GLSD, and the source or drain electrodes SL1-SL3 not connected to the memory page are connected to a source bias.

As shown in FIGS. 3 and 5, single memory units are connected in series to form a memory block by connecting the drain electrode of the field effect transistor of one memory unit to the source electrode of the transistor of an adjacent memory element, or by connecting the source electrode of one memory unit to the drain electrode of the transistor of an adjacent memory element and the source electrode of the transistor of an adjacent memory unit. In each memory unit used for forming the memory page, one of two electrodes of the resistance changeable component 102 not connected to the gate electrode of the transistor is connected to one of the word lines WL1-WL7, and the word lines WL1-WL7 are connected to the word selecting driving circuit WLD; the front and back ends of the memory page are respectively connected to the source electrode or drain electrode of one control FET, and the gate electrode of the control transistor of the front end of the memory page is connected to bit addressing lines BLS1-BLS3 which are connected to the bit-line selecting driving circuit BLSD, and the drain or source electrode of the control transistor not connected to the memory block is connected to one of the bit lines BL1-BL3, wherein the bit lines BL1-BL3 are connected to a circuit used for determining the memory state and the bit driving circuit BLD; the gate electrode of the control FET of the back end of the memory page is connected to the ground lines GLS1-GLS3 which are connected to the ground-line selecting driving circuit GLSD, and the source or drain electrodes SL1-SL3 not connected to the memory page are connected to a source bias, such that each two memory pages in the memory circuit are connected in series through a common source bias, and then the serial connections are connected in parallel to form a list, and also at least more than one memory block can be connected in parallel in this storage circuit.

Depends on the actual demands, according to various embodiments, the steps of the manufacturing process of the memory circuit are respectively illustrated in FIGS. 6A-6D, FIGS. 7A-7E, FIGS. 8A-8D, FIGS. 9A-9E, FIGS. 10A-10D, and FIGS. 11A-11D. In which layers 610, 710, 810, 910, 1010, 1110 are substrates. Layers 612, 712, 812, 912, 1012, 1112 are source/drain electrodes. Layers 620, 720, 820, 920, 1020, 1120 are oxide layers. Layers 630, 730, 830, 930, 1030, 1130 are gate electrodes. Layers 632, 732, 832, 932, 1032, 1132 are addressing gate. Layers 634, 734, 834, 934, 1034, 1134 are control gate. Layers 642, 646, 752, 756, 842, 846, 952, 956, 1044, 1144 are metals. Layers 644, 754, 844, 954, 1042, 1142 are oxides. Layers 742 and 942 are via. Layers 744 and 944 are plug. Layers 650, 760, 850, 960, 1050, 1150 are word lines.

As shown in the following tables 1 and 2, the operation of the memory circuit can be divided into setting and resetting, reading, or forming. We specifies that a fixed bias condition is applied onto the transistor of the memory unit before any operation is performed to the memory unit, wherein this bias condition should not change the state of the resistive switching component 102 of the memory unit, and the measured conducting current is used as a reference current value. If a certain operation is implemented to change the state of the resistive switching component 102 of the memory unit and thus enables the conducting current of the transistor of the memory unit is smaller relative to the reference current value, this state of the resistive switching component 102 is defined as 1; and if a certain operation is implemented to change the state of the resistive switching component 102 of the memory unit and thus enables the conducting current of the transistor of the memory unit is larger relative to the reference current value, this state of the resistive switching component 102 is defined as 0. The definition of 0 or 1 is used for identifying the relative storage state of the memory unit. Resetting refers to that the memory unit can be operated to a storage state 1; setting refers to that the memory unit can be operated to a storage state 0; and reading refers to an operation manner which can read out the storage state 0 or 1 of the memory unit. Forming refers to that the operating unit can be set to a storable and operable state. When it is desired to write information into a certain memory block of this memory circuit, if no operation has been performed to the memory page or a forming operation is needed for setting the memory page into an operable state, according to the characteristics of the resistance changeable component 102 in the memory unit, it is not necessary to perform the forming operation. If it is desired to write information into a certain memory block of the memory circuit, a resetting operation is first performed to set all of the memory units in the entire memory block into 0, wherein a certain memory block is selected through the bit-line selecting driving circuit BLSD and the ground-line selecting driving circuit GLSD, such that the control transistors of the front and back ends of the memory page are conducted to connect the selected bit lines BL1-BL3 and the source bias to the ground, and the word-line driving circuit WLD selects all of the words of the memory block, and a bias is applied to set the state of the resistive switching component 102 of the memory unit connected to the word lines WL1-WL7 into the state 0, thereby completing the resetting operation; when a setting operation is performed to the memory block, the bit-line selecting driving circuit BLSD selects the word control transistor of the memory block to conduct the same, the ground-line selecting driving circuit selects the ground-line control transistor of the memory block to cause the transistor into a non-conduction state, and the word-line selecting driving circuit selects the memory units desired to be set into the storage state 1 from this memory block, and a bias is applied onto the selected word lines WL1-WL7 such that the state of the resistance changeable component 102 of the selected memory unit is changed into the state that the resistance is relatively low or the current passing through the resistance changeable component 102 thereof are relatively high; on the other hand a bias is applied to unselected word lines WL1-WL7 such that the transistors of the unselected memory units are conducted without changing the state of the resistance changeable component 102 of the memory unit, the bit-line selecting driving circuit BLSD selects the memory page to be set, and a bias is applied and divided to the selected memory unit through the unselected memory units of this memory block, making the divided voltage which connects the word lines WL1-WL7 of the memory unit and connects the bit lines BL1-BL3 to this memory unit change the state of the resistance changeable component 102 of the selected memory unit into 1, thereby completing the setting operation.

TABLE 1

| Bias | Reset(V) | Set(V) | Read(V) |
|---|---|---|---|
| BL | 0 | $V_{cc}$ | $V_{sense}$ |
| BLS | $V_{on,BLS}$ | $V_{on,BLS}$ | $V_{on,BLS}$ |
| CG1 | $V_{reset}$ | $V_{pass1}$ | $V_{read}$ |
| . | . | . | . |
| . | . | . | . |
| . | . | . | . |
| $CG_{n-1}$ | $V_{reset}$ | $V_{pass1}$ | $V_{read}$ |
| $CG_n$ | $V_{reset}$ | $V_{set}$ | $V_{test}$ |
| $CG_{n+1}$ | $V_{reset}$ | $V_{pass1}$ | $V_{read}$ |
| . | . | . | . |
| . | . | . | . |
| . | . | . | . |
| $CG_{63}$ | $V_{reset}$ | $V_{pass1}$ | $V_{read}$ |
| $CG_{64}$ | $V_{reset}$ | $V_{pass2}$ | $V_{read}$ |
| GLS | $V_{on,GLS}$ | 0 | $V_{on,GLS}$ |
| SL | 0 | $V_{cc}$ | 0 |

TABLE 2

| Bias | Forming(V) | Reset(V) | Set(V) | Read(V) |
|---|---|---|---|---|
| BL | 0 | 0 | $V_{cc}$ | $V_{sense}$ |
| BLS | $V_{on,BLS}$ | $V_{on,BLS}$ | $V_{on,BLS}$ | $V_{on,BLS}$ |
| CG1 | $V_{form}$ | $V_{reset}$ | $V_{pass1}$ | $V_{read}$ |
| . | . | . | . | . |
| . | . | . | . | . |
| . | . | . | . | . |
| $CG_{n-1}$ | $V_{form}$ | $V_{reset}$ | $V_{pass1}$ | $V_{read}$ |
| $CG_n$ | $V_{form}$ | $V_{reset}$ | $V_{set}$ | $V_{test}$ |
| $CG_{n+1}$ | $V_{form}$ | $V_{reset}$ | $V_{pass1}$ | $V_{read}$ |
| . | . | . | . | . |
| . | . | . | . | . |
| . | . | . | . | . |
| $CG_{63}$ | $V_{form}$ | $V_{reset}$ | $V_{pass1}$ | $V_{read}$ |
| $CG_{64}$ | $V_{form}$ | $V_{reset}$ | $V_{pass2}$ | $V_{read}$ |
| GLS | $V_{on,GLS}$ | $V_{on,GLS}$ | 0 | $V_{on,GLS}$ |
| SL | 0 | 0 | $V_{cc}$ | 0 |

An active region where the memory circuit resides is defined on the wafer after an adjustment of doping concentration distribution, and gate oxide layers and gate electrodes are laminated on the active region, and sizes of respective memory units and control transistors are defined, and thereafter a source or drain region connecting between the transistors of the memory unit and connecting between the control transistor and the memory unit. Insulating dielectrics are filled between the transistors of the memory unit, and between the memory unit and the control transistor. Also a resistance changeable component 102 including metal-insulator-metal (MIM) is laminated on the gate electrode of the transistor of the memory unit, and then a word-line electrode is laminated on the resistive switching component 102. A bit-line electrode or a ground-line electrode is connected between gate electrodes of two control transistors, wherein the drain electrode of one of the control transistors is connected to an electrode and is connected to a circuit used for identifying the storage state, and the source electrode of the other control transistor is connected to the source bias.

When it is desired to change the memory unit including the transistor and the resistance changeable component 102, a bias is applied onto the memory unit, such that the resistance, conductivity or conducting current of the resistance changeable component 102 is changed and maintained after the change. This is because the change of the resistance of the resistance changeable component 102 connected in series with the transistor enables the divided voltage obtained by the gate electrode of the transistor to be changed under a fixed bias, such that the conducting current of the transistor channel is changed, and by measuring the conducting current of the channel, the storage state of the resistance changeable component 102 can be inferred.

Figure 12:
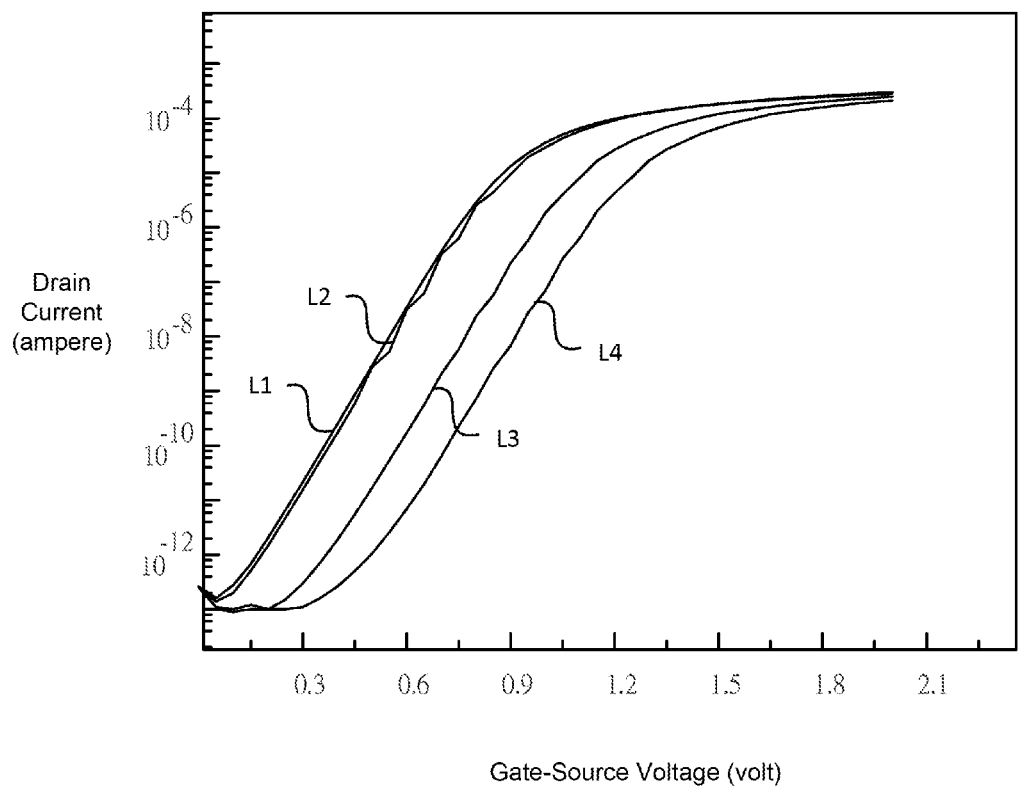
FIG. 12 illustrates the basic operation of the memory unit illustrated according to an embodiment of the disclosure.

FIG. 12 illustrates the basic operation of the memory unit 100a, wherein the line sections L1, L2, L3 and L4 respectively represent respective current characteristics under different resistances. For the memory unit 100a, when the resistance stored in the resistance changeable component 102 (MIM) is changed, the voltage across the gate oxide layer of the field effect transistor (FET) under the resistance is affected, which further changes the threshold voltage ($V_{th}$) of the FET or the conducting current of the channel, thereby achieving the aim of storing states and reading out states.

When writing of a certain state into a memory page of the memory circuit is implemented, the information stored in the memory page is returned to zero first, and then a bit position and a ground-line position are selected, and a voltage is applied to the bit control transistor and the ground-line control transistor to conduct them. Also a voltage is applied to the source bias and the selected bit lines BL1-BL3, and then a voltage is applied to the word lines WL1-WL7 of the memory unit into which the bit 1 is to be written, such that the resistance or conductivity or conducting current of the memory unit is increased or decreased and then maintained stablely. A voltage is applied to the word lines WL1-WL7 of the memory unit into which the bit 0 is to be written, such that the transistor of the original memory unit is conducted without changing the state of the resistance changeable component of the memory unit.

When the information of a certain memory block is read out, a bit position and a ground-line position are selected, and a voltage is applied to the bit control transistor and the ground-line control transistor to conduct them. Also a voltage is applied to the source bias, and an inductive voltage is applied to the selected bit lines BL1-BL3. By grounding the word lines WL1-WL7 of the memory unit to be tested and applying a voltage to word lines WL1-WL7 of other non-tested memory units, the transistors of the memory units are conducted without changing the state of the resistance changeable component of the memory unit. If the information stored in the memory unit to be tested is 0, then the transistor of the memory unit is conducted when the word lines WL1-WL7 are grounded. If the information stored in the memory unit to be tested is 1, then the transistor of the memory unit is conducted when the word lines WL1-WL7 are grounded. The storage-state testing circuit connected to the bit lines BL1-BL3 of the memory page is driven based on whether the memory unit to be tested is conducted, so as to determine the value of the resistance, resistivity or conducting current of the resistance changeable component stored in the memory unit.

Exemplary steps are included in the aforementioned description. However it is not necessary to perform these steps sequentially. It should be noted that, the sequence of the steps stated in the above embodiments can be adjusted according to actual demands, or even all or parts of the steps can be performed simultaneously, unless otherwise the sequences are stated clearly.

Although the present invention has been disclosed with reference to the above embodiments, these embodiments are not intended to limit the present invention. It will be apparent to those of skills in the art that various modifications and variations can be made without departing from the spirit and scope of the present invention. Therefore, the scope of the present invention shall be defined by the appended claims.

What is claimed is:

1. A non-volatile resistance random access storage circuit comprising a plurality of memory units, wherein each of the memory units comprises:
   a field effect transistor comprising a gate electrode, a source electrode, a drain electrode, and a channel between the gate electrode, the source electrode, and the drain electrode;
   a resistance changeable component comprising:
   a first electrode or interconnect electrically connected to the gate electrode; and
   a second electrode or interconnect electrically connected to a conducting electrode;
   wherein the resistance changeable component is formed by laminating at least one oxide layer onto at least one first metal layer, and then laminating at least one second metal layer onto the oxide layer,
   wherein the resistance, conductivity or conducting current of the resistance changeable component has equivalent to or more than two stable states by voltage or current sources applied between the first electrode or interconnect and the second electrode or interconnect of the resistance changeable component;
   wherein the first electrode or interconnect of the resistance changeable component and the gate electrode of the field effect transistor are in different layers and formed by different materials.

2. The non-volatile resistance random access storage circuit of claim 1, further comprising:
   a word line extended from a word selecting driving circuit used for control the memory unit; wherein the resistance changeable component is arranged at any position of the word line.

3. The non-volatile resistance random access storage circuit of claim 1, wherein the source electrode of each memory unit is coupled to the drain electrode of an adjacent memory unit in series to form a memory page and a plurality of memory page in parallel to form a memory block, and the non-volatile resistance random access storage circuit further comprises:
   a plurality of word lines electrically connected to a word selecting driving circuit;
   a plurality of bit lines electrically connected to a bit driving circuit;
   a first control transistor comprising a gate terminal, a first terminal and a second terminal, wherein the gate terminal is electrically connected to a bit-line selecting driving circuit through a bit addressing tine, the first terminal is electrically connected to the front end of the memory page, and the second terminal is electrically connected to one of the bit lines; and a second control transistor comprising a gate terminal, a first terminal and a second terminal, wherein the gate terminal is electrically connected to ,a ground-line selecting driving circuit through a ground line, the first terminal is electrically connected to the back end of the memory page, and the second terminal is electrically connected to a source bias;

wherein the second terminals of the resistance changeable components in the memory block are electrically connected to one of the word lines.

4. The non-volatile resistance random access storage circuit of claim 3, wherein two adjacent memory blocks are connected in series through a common source bias.

5. A non-volatile resistance random access storage circuit, comprising:
a field effect transistor comprising a gate electrode;
a plurality of resistance changeable components, each comprising:
a first terminal electrically connected to the gate electrode; and
a second terminal electrically connected to a corresponding conducting electrode;
wherein the resistance changeable component is formed by laminating at least one oxide layer onto at least one first metal layer, and then laminating at least one second metal layer onto the oxide layer, wherein the first terminal of the resistance changeable component and the gate electrode of the field effect transistor are in different layers and formed by different materials;
wherein the resistance, conductivity or conducting current of the resistance changeable component has equivalent to or more than two stable states according to a voltage difference or a current source applied between the first terminal and the second terminal of the resistance changeable component,
when a voltage source or a current source is applied to the corresponding conducting electrode, the voltage source makes a region of the transistor be conducted partially, and a memory unit is formed by the region and the resistance changeable component controlled by the conducting electrode.

6. A method for controlling a non-volatile resistance random access storage circuit, wherein the non-volatile resistance random access storage circuit comprises a plurality of memory units connected in series to form a memory page and a plurality of memory page in parallel to form a memory block, each of the memory units comprises a field effect transistor and a resistance changeable component, and the resistance changeable component is formed by laminating at least one oxide layer onto the at least one first metal layer, and then laminating at least one second metal layer onto the oxide layer, wherein the field effect transistor comprises a gate electrode, a source electrode, a drain electrode, and a channel between the gate electrode, the source electrode, and the drain electrode, and the resistance changeable component comprises a first terminal electrically connected to the gate electrode and a second terminal electrically connected to a conducting electrode, and the method comprises;
applying a fixed bias to the field effect transistor of the memory units before any operation is performed to the memory units, and measuring a conducting current as a reference current value;

performing a resetting operation to set the memory units of the memory block in a first, state, and
performing a setting operation to set the selected memory units of the memory block in a second state;
wherein during the resetting operation and the setting operation, bias Voltages with two different polarities are applied on corresponding word lines.

7. The method of claim 6, wherein the resetting operation comprises:
Selecting the memory block through a bit-line selecting driving circuit and a ground-line selecting driving circuit, such that a first control transistor and a second control transistor connected to the memory block are conducted;
connecting a corresponding bit line and a corresponding source bias to the ground, and
applying a first voltage source or current source to the memory units of the memory page, such that the state of the resistance changeable components of the memory units connected to the word lines is set into a first state.

8. The method of claim 6, wherein the setting operation comprises:
conducting the first control transistor of the memory page through the bit-line selecting driving circuit;
turning off the second control transistor of the memory page through the ground-line selecting driving circuit;
selecting a target memory unit from the memory block through the word selecting driving circuit, and applying a second voltage source or current source to a corresponding word line to change the state of the resistance changeable component of the selected memory units from the first state into a second state, and
applying a third voltage source or current source to the unselected word lines such that the transistors of the unselected memory units are conducted, and thus the resistance changeable components of the unselected memory units maintain the original state.

9. The method of claim 6, wherein the setting operation comprises:
selecting the memory page through the bit-line selecting driving circuit, and applying a fourth voltage source or current source such that the fourth source is divided into the selected memory units through the unselected memory units of the memory page, and
changing the state of the resistance changeable components of the selected memory units from the first state to the second state through voltage or current dividing of the fourth source.

10. The method of claim 6, further comprising:
applying a control voltage to the first control transistor and the second control transistor to conduct them;
applying a read voltage to the selected bit 1 ne:
applying a testing voltage to a word line corresponding to the memory unit to be tested;
applying a maintaining voltage to the word lines of other memory units, such that the transistors of the memory units are conducted without changing the state of the resistance changeable components of the memory units, and
driving a storage-state testing circuit connected to the bit line of the memory page based on the value stored in the memory cell.

* * * * *